US012805174B2

(12) United States Patent
Huang

(10) Patent No.: US 12,805,174 B2
(45) Date of Patent: Nov. 17, 2026

(54) DISPLAY WITH PIXELS HAVING THERMAL COMPENSATION STRUCTURES

(71) Applicants: Chengdu BOE Optoelectronics Technology Co., Ltd., Chengdu (CN); BOE Technology Group Co., Ltd., Beijing (CN)

(72) Inventor: Xing Huang, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 995 days.

(21) Appl. No.: 17/914,957

(22) PCT Filed: Oct. 27, 2021

(86) PCT No.: PCT/CN2021/126796

§ 371 (c)(1),
(2) Date: Sep. 27, 2022

(87) PCT Pub. No.: WO2022/247134

PCT Pub. Date: Dec. 1, 2022

(65) Prior Publication Data

US 2024/0251535 A1 Jul. 25, 2024

(30) Foreign Application Priority Data

May 27, 2021 (CN) ........................ 202110587142.2

(51) Int. Cl.
*H05K 7/20* (2006.01)
*H10K 59/122* (2023.01)
(Continued)

(52) U.S. Cl.
CPC ..... *H10K 59/8794* (2023.02); *H05K 7/20963* (2013.01); *H10K 59/122* (2023.02);
(Continued)

(58) Field of Classification Search
CPC .................................................. H10K 59/8794
See application file for complete search history.

(56) References Cited

U.S. PATENT DOCUMENTS

2006/0084006 A1* 4/2006 Kang .................... H10K 71/18
430/199
2013/0082288 A1* 4/2013 Kim .................... H10K 59/351
257/89
(Continued)

FOREIGN PATENT DOCUMENTS

CN 1564642 A 1/2005
CN 104350536 A 2/2015
(Continued)

OTHER PUBLICATIONS

PCT/CN2021/126796 international search report.
PCT/CN2021/126796 Written Opinion.
CN202110587142.2 first office action dated Nov. 14, 2024.

*Primary Examiner* — Peter Bradford
(74) *Attorney, Agent, or Firm* — IPro, PLLC

(57) ABSTRACT

The present disclosure provides a display device and a display substrate. The display substrate may include a substrate, a plurality of pixel units and a thermal compensation structure. The plurality of pixel units are arranged on a side of the substrate. Each of the pixel units includes a plurality of sub-pixels, and the plurality of sub-pixels include a first sub-pixel and a second sub-pixel. A brightness decay rate of the first sub-pixel is less than that of the second sub-pixel. A thermal compensation structure is configured to provide heat. Heat provided by the thermal compensation structure for the first sub-pixel is greater than that provided by the thermal compensation structure for the second sub-pixel. The heat provided by the thermal compensation structure for the second sub-pixel is greater than or equal to zero.

18 Claims, 4 Drawing Sheets

(51) Int. Cl.

| | |
|---|---|
| ***H10K 59/131*** | (2023.01) |
| ***H10K 59/35*** | (2023.01) |
| ***H10K 59/80*** | (2023.01) |
| ***H10K 77/00*** | (2023.01) |

(52) U.S. Cl.

CPC ......... *H10K 59/131* (2023.02); *H10K 59/353* (2023.02); *H10K 77/00* (2023.02)

(56) References Cited

U.S. PATENT DOCUMENTS

| | | | | |
|---|---|---|---|---|
| 2013/0321361 | A1 | 12/2013 | Lynch et al. | |
| 2015/0042913 | A1 | 2/2015 | You et al. | |
| 2015/0076455 | A1 | 3/2015 | Mizusaki et al. | |
| 2016/0079317 | A1* | 3/2016 | Jeon | G09G 3/3233 315/115 |
| 2018/0331319 | A1 | 11/2018 | Hiraga et al. | |
| 2019/0013371 | A1* | 1/2019 | Kim | H10K 71/135 |
| 2019/0016198 | A1* | 1/2019 | Kim | B32B 17/10027 |
| 2019/0074470 | A1* | 3/2019 | Takagi | H10K 59/8794 |
| 2019/0181205 | A1* | 6/2019 | Kim | H10D 86/451 |
| 2020/0235328 | A1 | 7/2020 | Shi et al. | |
| 2020/0303671 | A1 | 9/2020 | Song | |
| 2021/0005138 | A1* | 1/2021 | Umezawa | G09G 3/3233 |
| 2021/0408180 | A1* | 12/2021 | Hsu | H10K 50/16 |
| 2022/0028938 | A1* | 1/2022 | Zhao | H10K 59/131 |
| 2022/0310761 | A1* | 9/2022 | Kim | H10K 59/123 |

FOREIGN PATENT DOCUMENTS

| | | | | | |
|---|---|---|---|---|---|
| CN | 104732954 | A | | 6/2015 | |
| CN | 108630829 | A | | 10/2018 | |
| CN | 108648635 | A | | 10/2018 | |
| CN | 110072315 | A | | 7/2019 | |
| CN | 110993827 | A | | 4/2020 | |
| CN | 111933817 | A | | 11/2020 | |
| CN | 215644556 | U | | 1/2022 | |
| CN | 222750824 | U | * | 4/2025 | |
| JP | 2005174803 | A | | 6/2005 | |
| JP | 2005321684 | A | | 11/2005 | |
| JP | 2006244847 | A | | 9/2006 | |
| JP | 2015106096 | A | | 6/2015 | |
| WO | WO-2004051349 | A1 | * | 6/2004 | G02F 1/133382 |

* cited by examiner

DISPLAY WITH PIXELS HAVING THERMAL COMPENSATION STRUCTURES

CROSS-REFERENCE TO RELATED APPLICATIONS

The present disclosure is a US national phase of PCT application No. PCT/CN2021/126796 filed on Oct. 27, 2021, which claims the priority of the Chinese Patent Application No. CN202110587142.2, filed on May 27, 2021, the entire contents of which are incorporated herein by reference.

TECHNICAL FIELD

The present disclosure relates to the field of display technology, and in particular, to a display device and a display substrate.

BACKGROUND

With the vigorous development of the automobile industry, on-board display has developed rapidly. At present, the on-board display is not simply monochrome display, but is developing towards full color, large size and diversification. Using the on-board display device, driving data information, navigation maps, Internet information, audio-video entertainment information and the like can be displayed to improve user experience. However, the existing on-board display devices are prone to white balance shift/offset problems.

SUMMARY

The purpose of the present disclosure is to provide a display device and a display substrate, which can solve the problem of white balance shift caused by the large difference in brightness decay rate of each sub-pixel.

According to one aspect of the present disclosure, there is provided a display substrate, including:

a substrate;

a plurality of pixel units arranged on a side of the substrate, each of the pixel units includes a plurality of sub-pixels, the plurality of sub-pixels include a first sub-pixel and a second sub-pixel, and a brightness decay rate of the first sub-pixel is less than a brightness decay rate of the second sub-pixel;

a thermal compensation structure for providing heat, heat provided by the thermal compensation structure for the first sub-pixel is greater than heat provided by the thermal compensation structure for the second sub-pixel, and the heat provided by the thermal compensation structure for the second sub-pixel is greater than or equal to zero.

Further, each of the pixel units further includes a third sub-pixel, the brightness decay rate of the second sub-pixel is lower than a brightness decay rate of the third sub-pixel, the heat provided by the thermal compensation structure for the second sub-pixel is greater than heat provided by the thermal compensation structure for the third sub-pixel, and the heat provided by the thermal compensation structure for the third sub-pixel is greater than or equal to zero.

Further, the first sub-pixel is a blue sub-pixel, the second sub-pixel is a red sub-pixel, and the third sub-pixel is a green sub-pixel.

Further, the display substrate includes:

a driving circuit layer disposed on a side of the substrate and including a plurality of driving transistors electrically connected with the plurality of sub-pixels in one-to-one correspondence, and the thermal compensation structure is formed by the driving transistors.

Further, the plurality of driving transistors include a first driving transistor, a second driving transistor and a third driving transistor whose heat generation decreases in sequence, an orthographic projection of the first driving transistor on the substrate is located in an orthographic projection area of the first sub-pixel on the substrate: an orthographic projection of the second driving transistor on the substrate is located in an orthographic projection area of the second sub-pixel on the substrate: and an orthographic projection of the third driving transistor on the substrate is located in an orthographic projection area of the third sub-pixel on the substrate.

Further, the plurality of driving transistors include a first driving transistor, a second driving transistor and a third driving transistor whose heat generation decreases in sequence, orthographic projections of the first driving transistor and the third driving transistor on the substrate are located in an orthographic projection area of the first sub-pixel on the substrate; and an orthographic projection of the second driving transistor on the substrate is located within an orthographic projection area of the second sub-pixel on the substrate.

Further, the plurality of driving transistors include a first driving transistor, a second driving transistor and a third driving transistor whose heat generation decreases in sequence, an orthographic projection of the first driving transistor on the substrate is located in an orthographic projection area of the first sub-pixel on the substrate: and orthographic projections of the second driving transistor and the third driving transistor on the substrate are located in an orthographic projection area of the second sub-pixel on the substrate.

Further, the outer periphery of one or more sub-pixels in the plurality of sub-pixels is surrounded by a first heat insulation structure.

Further, the display substrate includes:

a pixel definition layer arranged on a side of the substrate and provided with a plurality of openings, the plurality of sub-pixels being arranged in the plurality of openings in a one-to-one correspondence;

a heat insulating medium, sidewalls of at least one of the openings in the pixel definition layer being doped with the heat insulating medium to form the first heat insulating structure, and a thermal conductivity of the heat insulating medium being smaller than that of a material of the pixel definition layer.

Further, the heat insulating medium is uniformly doped in the pixel definition layer.

Further, the sidewalls of the openings provided with the first sub-pixels are doped with the heat insulating medium.

Further, the sidewalls of the openings provided with the second sub-pixels are doped with the heat insulating medium, and a doping concentration of the sidewalls of the openings provided with the first sub-pixels is greater than a doping concentration of the sidewalls of the openings provided with the second sub-pixels.

Further, each of the pixel units further includes a third sub-pixel, the brightness decay rate of the second sub-pixel is lower than a brightness decay rate of the third sub-pixel, and sidewalls of the openings provided with the third sub-pixels is doped with the heat insulating medium, and a doping concentration of the sidewalls of the openings provided with the second sub-pixels is greater than that of the sidewalls of the openings provided with the third sub-pixels.

Further, the display substrate further includes:

a planarization layer, disposed on a side of the substrate, the pixel definition layer and the plurality of sub-pixels are disposed on a surface of the planarization layer away from the substrate: partial region of the planarization layer is doped with the thermal insulation medium to form second thermal insulation structures. The second thermal insulation structures are of a cylindrical structure. Outer peripheries of orthographic projections of one or more sub-pixels in the plurality of sub-pixels on the planarization layer are surrounded by the second heat insulating structures.

Further, the heat insulating medium is nanoparticles.

Further, the diameter of the nanoparticles is 10 nm-200 nm.

Further, the heat insulating medium is an inorganic material.

Further, the heat insulating medium is silicon oxide or aluminum oxide.

Further, a mass fraction of the heat insulating medium is 0.5%-5%.

According to one aspect of the present disclosure, there is provided a display device including the above-mentioned display substrate.

In the display device and the display substrate of the present disclosure, the heat provided by the thermal compensation structure for the first sub-pixel is greater than the heat provided by the thermal compensation structure for the second sub-pixel, which can speed up the brightness decay rate of the first sub-pixel, and make the brightness decay rate of the first sub-pixel close to the brightness decay speed of the second sub-pixel, thereby solving the problem of white balance shift caused by the large difference in the brightness decay rate of each sub-pixel.

Figure 1:
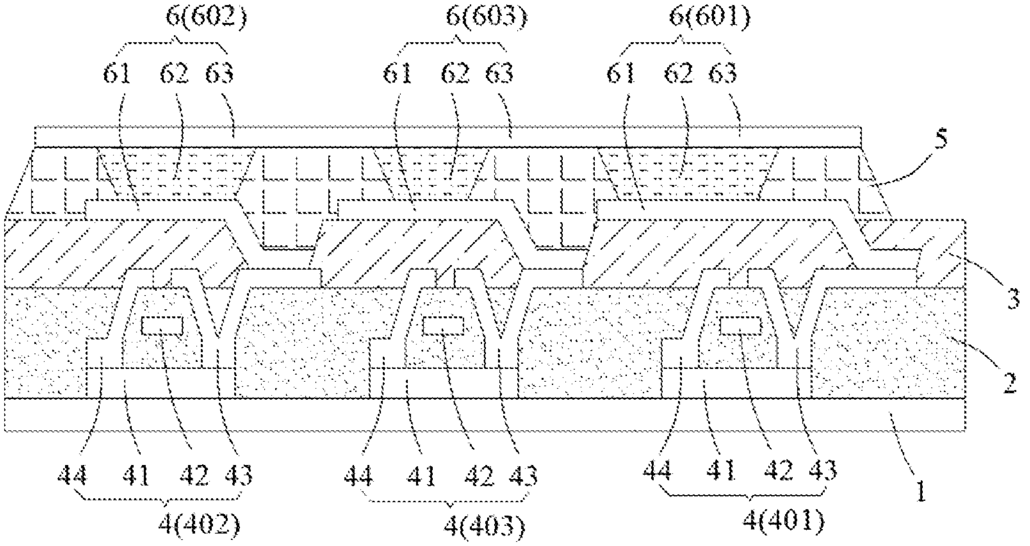
FIG. 1 is a schematic diagram of a display substrate according to an embodiment of the present disclosure.

Description of reference numerals: 1, substrate: 2, insulating layer: 3, planarization layer: 4, driving transistor: 41, active layer: 42, gate electrode: 43, drain electrode: 44, source electrode: 401, first driving transistor: 402, second driving transistor: 403, third driving transistor: 5, pixel definition layer: 6, sub-pixel: 61, first electrode: 62, light-emitting material layer: 63, second electrode: 601, first sub-pixel: 602, second sub-pixel: 603, third sub-pixel: 7, heat insulating medium.

DETAILED DESCRIPTION OF THE EMBODIMENTS

Exemplary embodiments will be described in detail herein, examples of which are illustrated in the accompanying drawings. Where the following description refers to the drawings, the same numerals in different drawings refer to the same or similar elements unless otherwise indicated. The implementations described in the following exemplary embodiments are not intended to represent all implementations consistent with this disclosure. Rather, they are merely examples of means consistent with some aspects of the present disclosure, as recited in the appended claims.

The terminology used in the present disclosure is for the purpose of describing particular embodiments only and is not intended to limit the present disclosure. Unless otherwise defined, technical or scientific terms used in this disclosure should have the ordinary meaning as understood by one of ordinary skill in the art to which this disclosure belongs. As used in this disclosure and in the claims, "first," "second," and similar terms do not denote any order, quantity, or importance, but are merely used to distinguish the various components. Likewise, "a" or "an" and the like do not denote a quantitative limitation, but rather denote the presence of at least one. "Plural" or "several" means two or more. Unless otherwise indicated, terms such as "front," "rear," "lower," and/or "upper" are for convenience of description and are not limited to one location or one spatial orientation. Words like "include" or "comprise" mean that the elements or items appearing before "include" or "comprise" cover the elements or items listed after "include" or "comprise" and their equivalents, and do not exclude other elements or objects. "connect" or "connected" and similar words are not limited to physical or mechanical connections, but may include electrical connections, whether direct or indirect. As used in this disclosure and the appended claims, the singular forms "a," "the," and "said" are intended to include the plural forms as well, unless the context clearly dictates otherwise. It will also be understood that the term "and/or" as used herein refers to and includes any and all possible combinations of one or more of the associated listed items.

In the related art, an automobile OLED display panel is usually required to run and test at a high temperature of 85° C. When brightness decreases to 80% of initial brightness, offset/shift of the white balance coordinates (W-CIEx, W-CIEy) from an initial value cannot exceed ±0.01.

In the development process of the automobile OLED display panel, lifetime index generally only considers lifetimes of red, green and blue sub-pixels at ambient temperature. The lifetime LT80 of the red, green and blue sub-pixels of an existing automobile OLED display panel at 85° C. is 950 h, 450 h and 1200 h, respectively. According to chromaticity coordinates of the red, green and blue sub-pixels of the automobile OLED display panel and initial chromaticity coordinates of a corresponding white point, (0.3057, 0.3016), it can be calculated that when brightness of mixed white light of the red, green and blue sub-pixels decays to 80% of the initial brightness, corresponding time is 549 h, that is, LT80 is 549 h, and corresponding white point coordinate shifts W-ΔCIEx and W-ΔCIEy are −0.0011 and −0.0185, respectively, as shown in Table 1.

TABLE 1

| | theoretical value | actual value |
|---|---|---|
| LT80/h | 549 | 410 |
| R-Lv % | 87.9% | 88.4% |
| G-Lv % | 76.2% | 76.0% |
| B-Lv % | 90.3% | 90.4% |
| W-CIEx | 0.3057 | 0.3062 |
| W-CIEy | 0.3016 | 0.3013 |
| W-ΔCIEx | −0.0011 | −0.0006 |
| W-ΔCIEy | −0.0185 | −0.0188 |

In the actual development of the automobile OLED display panel, due to factors such as efficiency loss of light-emitting device and thermal effect of current inside the panel, there will be a problem of panel self-heating, resulting in the temperature of the automobile OLED display panel exceeding the ambient temperature. At an ambient temperature of 85° C., the average temperature inside the display panel can reach 93° C. Based on the chromaticity coordinates of the red, green and blue sub-pixels of the automobile OLED display panel and target chromaticity coordinates of the corresponding white point, it can be calculated that at 93° C., when the brightness of the mixed white light of the red, green and blue sub-pixels decays to 80% of the initial brightness, the corresponding time is 410 h, and corresponding white point coordinate shifts W-ΔCIEx and W-ΔCIEy are −0.0006 and −0.0188, respectively. See Table 1 for details. It can be seen that the white balance shift is too large. Luminance decay ratios of its red, green and blue sub-pixels are analyzed to be 88.4%, 76% and 90.4%, respectively. It can be seen that the excessive white balance shift is because luminance decay rates of the blue sub-pixels, the red sub-pixels, and the green sub-pixels increase sequentially.

The conventional idea to solve this problem is to adjust light-emitting areas of light-emitting regions where different sub-pixels are located, so as to adjust the brightness decay rates of different sub-pixels to be consistent. However, this solution involves the design and tension of fine metal masks, etc., and the change process is relatively complicated. Further, this solution cannot solve the problem of excessively fast attenuation of the luminous brightness of the green sub-pixels.

Embodiments of the present disclosure provide a display substrate. As shown in FIG. 1, the display substrate may include a substrate 1, a plurality of pixel units and a thermal compensation structure, where:

the plurality of pixel units are arranged on a side of the substrate 1, each pixel unit includes a plurality of sub-pixels 6, and the plurality of sub-pixels 6 includes a first sub-pixel 601 and a second sub-pixel 602, and a brightness decay rate of the first sub-pixel 601 is lower than a brightness decay rate of the second sub-pixel 602. The thermal compensation structure is used for providing heat, and heat provided by the thermal compensation structure for the first sub-pixel 601 is greater than heat provided by the thermal compensation structure for the second sub-pixel 602. The heat provided by the thermal compensation structure for the second sub-pixel 602 is greater than or equal to zero.

In the display substrate of the embodiments of the present disclosure, the heat provided by the thermal compensation structure for the first sub-pixel 601 is greater than the heat provided by the thermal compensation structure for the second sub-pixel 602, which can accelerate the brightness decay rate of the first sub-pixel 601 so that the brightness decay rate of the first sub-pixel 601 is close to the brightness decay rate of the second sub-pixel 602, solving the problem of white balance shift caused by the large difference in the brightness decay rate of each sub-pixel.

The following is a detailed description of the various parts of the display substrate according to the embodiments of the present disclosure.

As shown in FIG. 1, the substrate 1 may be a rigid substrate. The rigid substrate may be a glass substrate or a PMMA (Polymethyl methacrylate) substrate or the like. Of course, the substrate 1 can alternatively be a flexible substrate. The flexible substrate can be a PET (Polyethylene terephthalate) substrate, PEN (Polyethylene naphthalate) substrate or a PI (Polyimide) substrate.

As shown in FIG. 1, the display substrate of the embodiments of the present disclosure may include a driving circuit layer. The driving circuit layer is arranged on the substrate 1. The driving circuit layer may include a plurality of driving transistors 4. The driving transistor 4 may be a thin film transistor, but the embodiments of the present disclosure are not limited thereto. The thin film transistor can be a top-gate thin film transistor, and of course, the thin film transistor can alternatively be a bottom-gate thin film transistor. Taking the thin film transistor as a top-gate thin film transistor as an example, the driving transistor 4 may include an active layer 41, a gate insulating layer, a gate electrode 42, an interlayer insulating layer, a drain electrode 43 and a source electrode 44. The gate insulating layer and the interlayer insulating layer constitute an insulating layer 2 in FIG. 1. The active layer 41 can be provided on the substrate 1. The gate insulating layer can be disposed on the substrate 1 and cover the active layer 41. The gate electrode 42 may be disposed on a side of the gate insulating layer away from the substrate 1. The interlayer insulating layer may be provided on the gate insulating layer and cover the gate electrode 42. The drain electrode 43 and the source electrode 44 may be provided on the interlayer insulating layer, and connected with the active layer 41 via a via hole passing through the interlayer insulating layer and the gate insulating layer. In addition, taking the plurality of driving transistors 4*e* all being thin-film transistors as an example, thickness and aspect ratio of each driving transistor 4 may be substantially the same. The display substrate of the embodiments of the present disclosure may include a planarization layer 3. The planarization layer 3 may be disposed on a side of the driving circuit layer away from the substrate 1. The planarization layer 3 may be disposed on the side of the above-mentioned interlayer insulating layer away from the substrate 1, and cover the drain electrodes 43 and the source electrodes 44 of the thin film transistors. In addition, the driving current of the driving transistor 4 has a thermal effect, so that the driving transistor 4 gives out heat. The plurality of driving transistors 4 may include a plurality of first driving transistors 401, a plurality of second driving transistors 402 and a plurality of third driving transistors 403 whose heat generation decreases in sequence, that is, the heat generation of the first driving transistor 401 is greater than that of the second driving transistor 402, and the heat generation of the second driving transistor may be greater than that of the third driving transistor 403. That is to say, the driving currents of the first driving transistor 401, the second driving transistor 402 and the third driving transistor 403 decrease sequentially.

As shown in FIG. 1, the plurality of sub-pixels 6 may include a first sub-pixel 601, a second sub-pixel 602 and a third sub-pixel 603. The sub-pixels 6 may be arranged at intervals. Each sub-pixel 6 may include a first electrode 61, a light-emitting material layer 62 and a second electrode 63. The first electrode 61 can be an anode, and the second electrode 63 can be a cathode. The first electrode 61 can be disposed on a side of the planarization layer 3 away from the substrate 1, the light-emitting material layer 62 can be disposed on a side of the first electrode 61 away from the substrate 1, and the second electrode 63 can be disposed on a side of the light-emitting material layer 62 away from the substrate 1. The light-emitting material layer 62 may be an organic electroluminescent material layer 62. The first electrode 61 can be connected with the drain electrode 43 or the source electrode 44 of the above-mentioned thin film transistor via a via hole penetrating through the planarization layer 3, so as to electrically connect the sub-pixel 6 and the driving transistor 4. Each sub-pixel 6 may further include a hole injection layer, a hole transport layer, an electron injection layer, and an electron transport layer. The hole injection layer and the hole transport layer are provided between the first electrode 61 and the light emitting material layer 62, and the electron injection layer and the electron transport layer are provided between the second electrode 63 and the light emitting material layer 62. Taking the plurality of sub-pixels 6 including a first sub-pixel 601, a second sub-pixel 602 and a third sub-pixel 603 as an example, the first driving transistor 401 is electrically connected with the first sub-pixel 601, the second driving transistor 402 is electrically connected with the second sub-pixel 602, and the third driving transistor 403 is electrically connected with the third sub-pixel 603. The luminance decay rate of the first sub-pixel 601 may be lower than that of the second sub-pixel 602, and the luminance decay rate of the second sub-pixel 602 may be lower than that of the third sub-pixel 603. In one embodiment, the first sub-pixel 601 is a blue sub-pixel, one of the second sub-pixel 602 and the third sub-pixel 603 is a green sub-pixel, and the other is a red sub-pixel. In another embodiment, the first sub-pixel 601 is a red sub-pixel, one of the second sub-pixel 602 and the third sub-pixel 603 is a green sub-pixel, and the other is a blue sub-pixel. In yet another embodiment, the first sub-pixel 601 is a green sub-pixel, one of the second sub-pixel 602 and the third sub-pixel 603 is a red sub-pixel, and the other is a blue sub-pixel.

As shown in FIG. 1, the display substrate of the embodiments of the present disclosure may include a pixel definition layer 5. The pixel definition layer 5 may be provided on a side of the substrate 1. Specifically, the pixel definition layer 5 may be disposed on a side of the aforementioned planarization layer 3 away from the substrate 1. The pixel definition layer 5 may be provided with a plurality of openings. The plurality of openings are arranged at intervals. The above-mentioned light-emitting material layers 62 of the plurality of sub-pixels 6 are disposed in the plurality of openings of the pixel definition layer 5 in a one-to-one correspondence.

Figure 3:
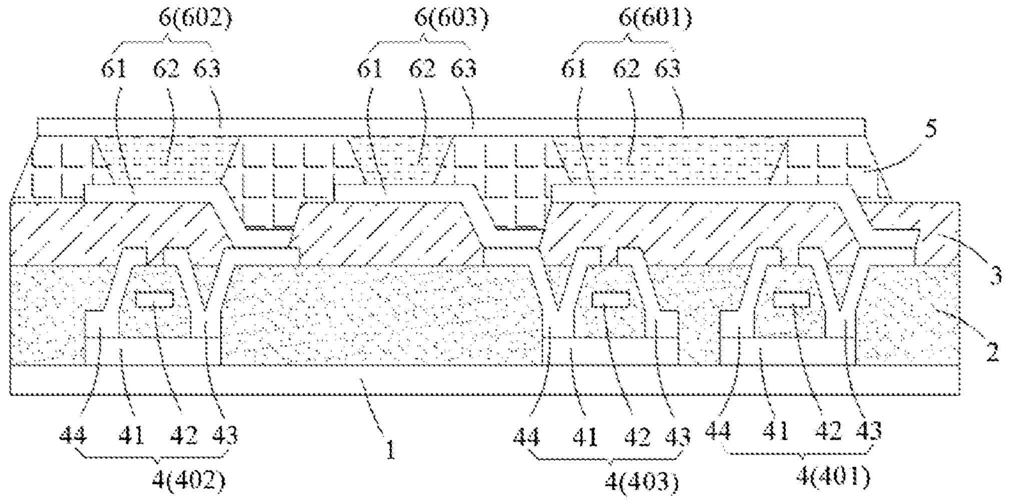
FIG. 3 is another schematic diagram of a display substrate according to an embodiment of the present disclosure.
Figure 4:
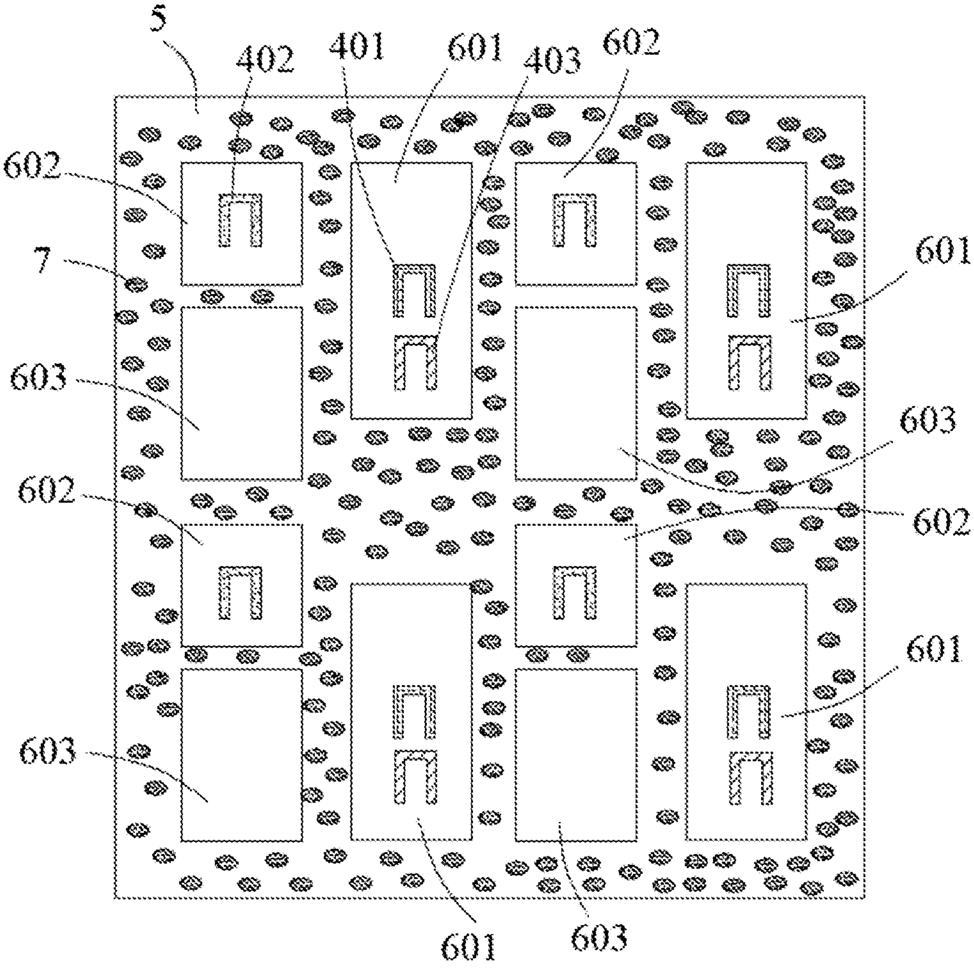
FIG. 4 is a schematic diagram of the plan layout of the display substrate shown in FIG. 3.

The thermal compensation structure is used to provide heat for the first sub-pixels 601. The thermal compensation structure may include a first thermal compensation structure. In one embodiment, as shown in FIG. 1, FIG. 2, FIG. 5 and FIG. 6, the above-mentioned first driving transistors 401 constitute the first thermal compensation structure, and the first driving transistors 401 are disposed in part of the driving circuit layer corresponding to the first sub-pixels 601, that is, an orthographic projection of the first driving transistor 401 on the substrate 1 is located in an orthographic projection area of the first sub-pixel 601 on the substrate, so that the heat emitted by the first driving transistor 401 can be conducted more to the first sub-pixel 601. In yet another embodiment, as shown in FIG. 3 and FIG. 4, the first driving transistors 401 and the third driving transistors 403 constitute the first thermal compensation structure, and are provided in part of the driving circuit layer corresponding to the first sub-pixels 601. That is, orthographic projections of the first driving transistor 401 and the third driving transistor 403 on the substrate 1 are both located in the orthographic projection area of the first sub-pixel 601 on the substrate. In another embodiment, the first driving transistors 401 and the second driving transistors 402 constitute the first thermal compensation structure, and are disposed in part of the driving circuit layer corresponding to the first sub-pixels 601, that is, orthographic projections of the first driving transistor 401 and the second driving transistor 402 on the substrate 1 are both located in the orthographic projection area of the first sub-pixel 601 on the substrate. In yet another embodiment, the second driving transistors 402 and the third driving transistors 403 constitute the first thermal compensation structure, and are disposed in part of the driving circuit layer corresponding to the first sub-pixels 601, that is, orthographic projections of the second driving transistor 402 and the third driving transistor 403 on the substrate 1 are both located in the orthographic projection area of the first sub-pixel 601 on the substrate. In other embodiments of the present disclosure, the first driving transistors 401, the second driving transistors 402 and the third driving transistors 403 constitute the first thermal compensation structure, and the first driving transistors 401, the second driving transistors 402 and the third driving transistors 403 are all disposed in part of the driving circuit layer corresponding to the first sub-pixels 601, that is, orthographic projections of the first driving transistor 401, the second driving transistor 402 and the third driving transistor 403 on the substrate 1 are all located in the orthographic projection area of the first sub-pixel 601 on the substrate, so that heat generated by the first driving transistor 401, the second driving transistor 402 and the third driving transistor 403 can be more conducted to the first sub-pixel 601.

Figure 5:
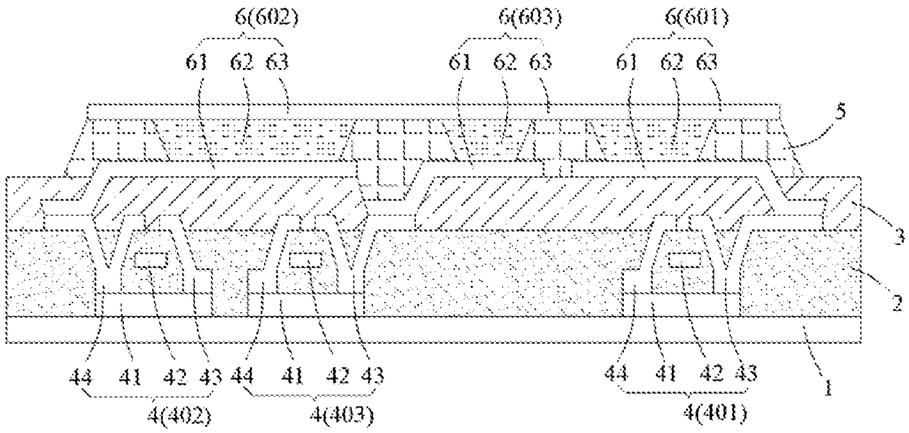
FIG. 5 is yet another schematic diagram of a display substrate according to an embodiment of the present disclosure.
Figure 6:
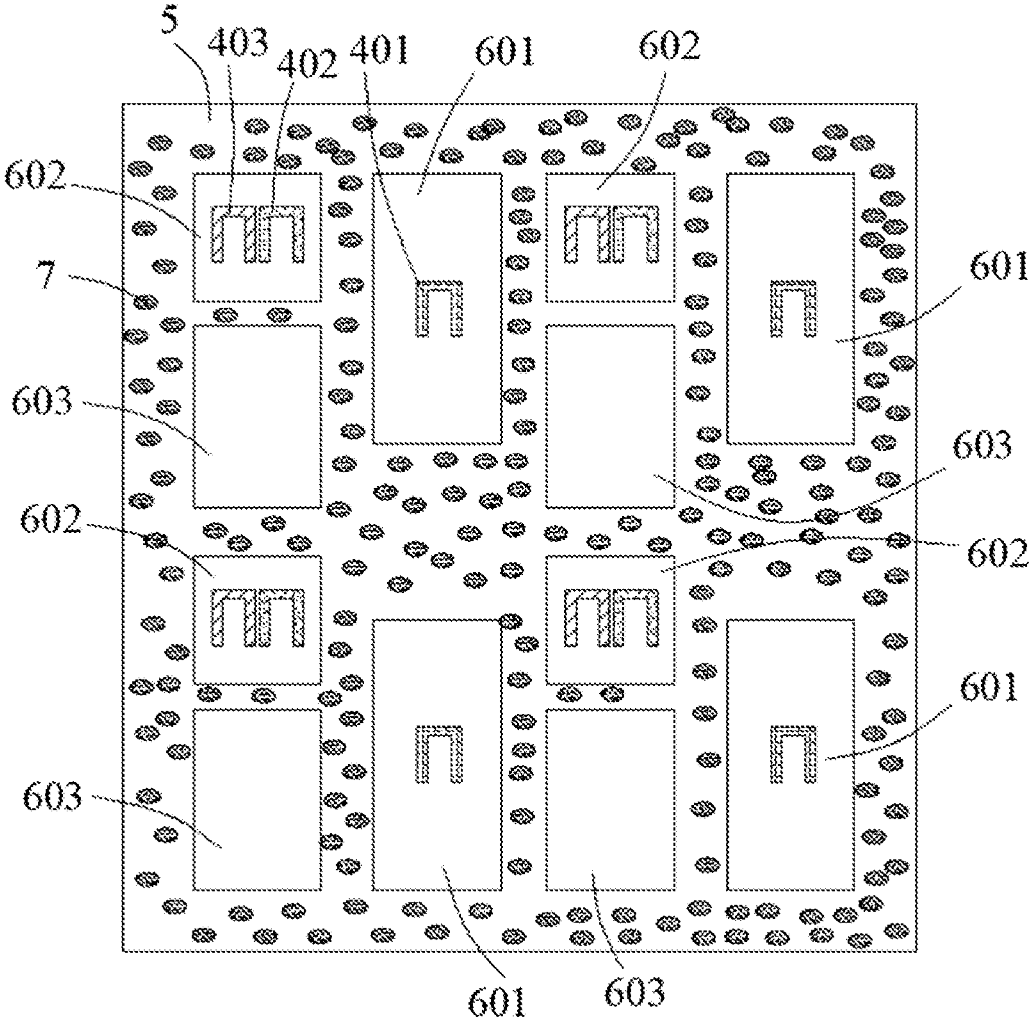
FIG. 6 is a schematic plan layout of the display substrate shown in FIG. 5.
Figure 7:
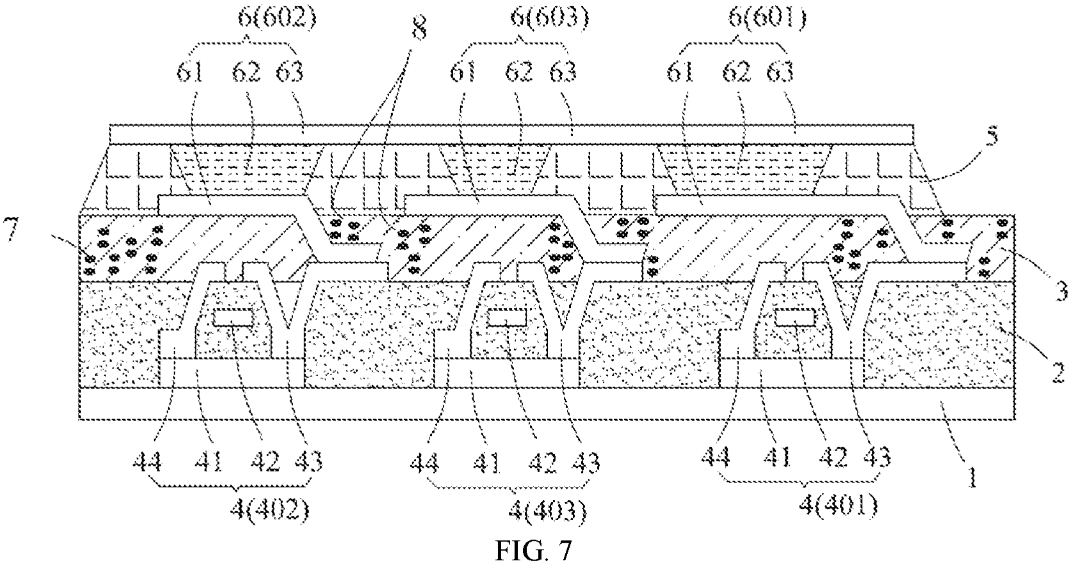
FIG. 7 is still another schematic diagram of a display substrate according to an embodiment of the present disclosure.
Figure 8:
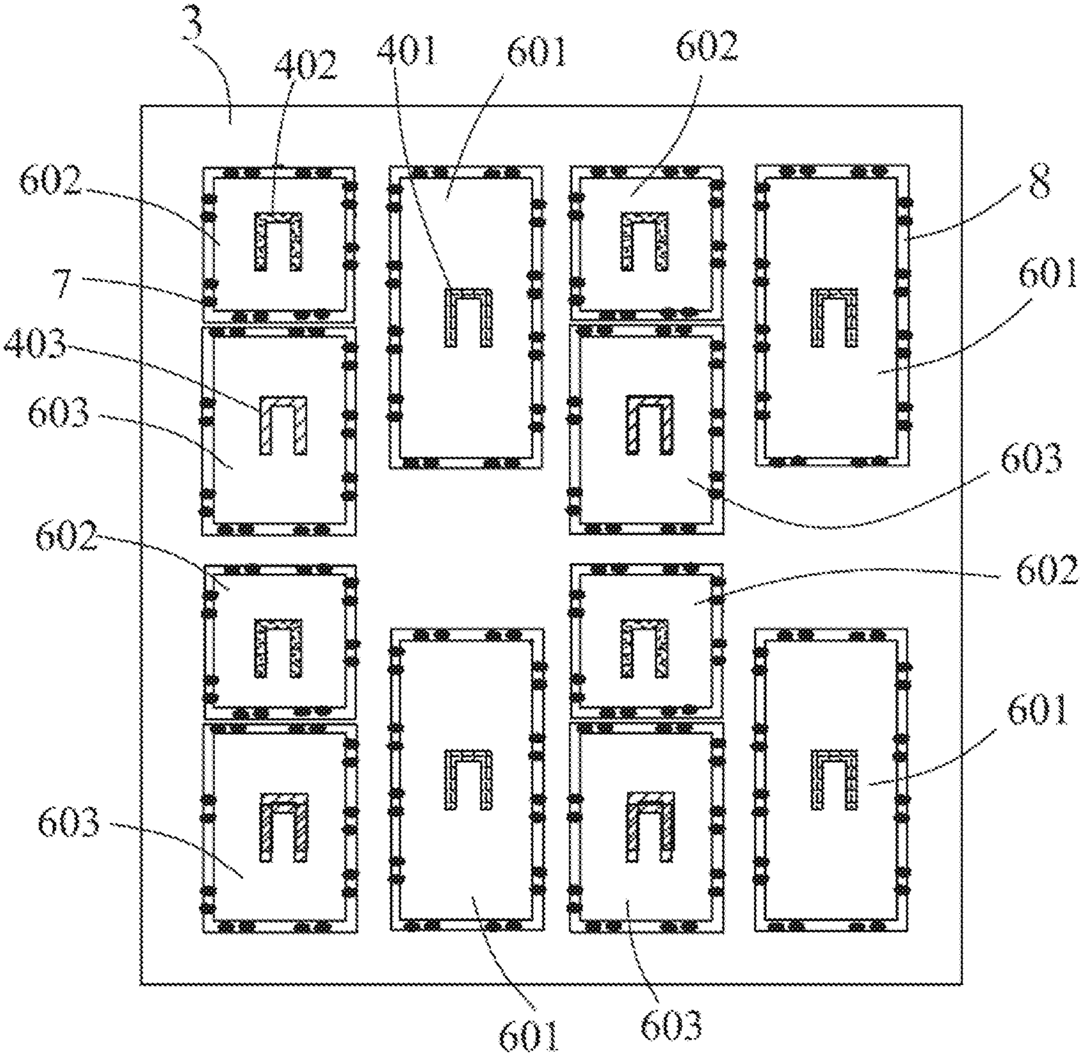
FIG. 8 is a schematic plan layout of the display substrate shown in FIG. 7.

The thermal compensation structure may also include a second thermal compensation structure. The second thermal compensation structure is used to provide heat for the second sub-pixels 602. The amount of heat provided by the thermal compensation structure for the first sub-pixel 601 is greater than the amount of heat provided by the thermal compensation structure for the second sub-pixel 602, i.e., the first thermal compensation structure provides more heat for the first sub-pixel 601 than the second thermal compensation structure for the second sub-pixel 602. As shown in FIG. 5 and FIG. 6, with the above-mentioned first driving transistors 401 constituting the first thermal compensation structure as an example, the above-mentioned second driving transistors 402 and third driving transistors 403 can constitute the second thermal compensation structure, and the second driving transistors 402 and the third driving transistors 403 are disposed in part of the driving circuit layer corresponding to the second sub-pixels 602, that is, the orthographic projections of the second driving transistor 402 and the third driving transistor 403 on the substrate 1 are located in the orthographic projection area of the second sub-pixel 602 on the substrate. Of course, the second thermal compensation structure can alternatively be composed of only the second driving transistor 402, that is, a part of the driving circuit layer corresponding to the second sub-pixels 602 is only provided with the second driving transistors 402, that is, only the orthographic projection of the second driving transistor 402 on the substrate 1 is located within the orthographic projection area of the second sub-pixel 602 on the substrate. Taking the above-mentioned first driving transistors 401 and second driving transistors 402 constituting the first thermal compensation structure as an example, the above-mentioned third driving transistors 403 can constitute the second thermal compensation structure, and the third driving transistors 403 can be provided in a part of the driving circuit layer corresponding to the second sub-pixels 602, that is, the orthographic projection of the third driving transistor 403 on the substrate 1 is located in the orthographic projection area of the second sub-pixel 602 on the substrate. Taking the above-mentioned first driving transistors 401 and third driving transistors 403 constituting the first thermal compensation structure as an example, the above-mentioned second driving transistors 402 can constitute the second thermal compensation structure, and the second driving transistors 402 are disposed in a part of the driving circuit layer corresponding to the second sub-pixels 602, that is, the orthographic projection of the second driving transistor 402 on the substrate 1 is located within the orthographic projection area of the second sub-pixel 602 on the substrate. The thermal compensation structure may also include a third thermal compensation structure. The heat provided by the second thermal compensation structure for the second sub-pixel 602 is greater than the heat provided by the third thermal compensation structure for the third sub-pixel 603. When the first driving transistors 401 constitute the first thermal compensation structure and the second driving transistors 402 constitute the second thermal compensation structure, the third driving transistors 403 can constitute the third thermal compensation structure, and is disposed in a part of the driving circuit layer corresponding to the third sub-pixels 603, that is, the orthographic projection of the third driving transistor 403 on the substrate 1 is located in the orthographic projection area of the third sub-pixel 603 on the substrate.

Figure 2:
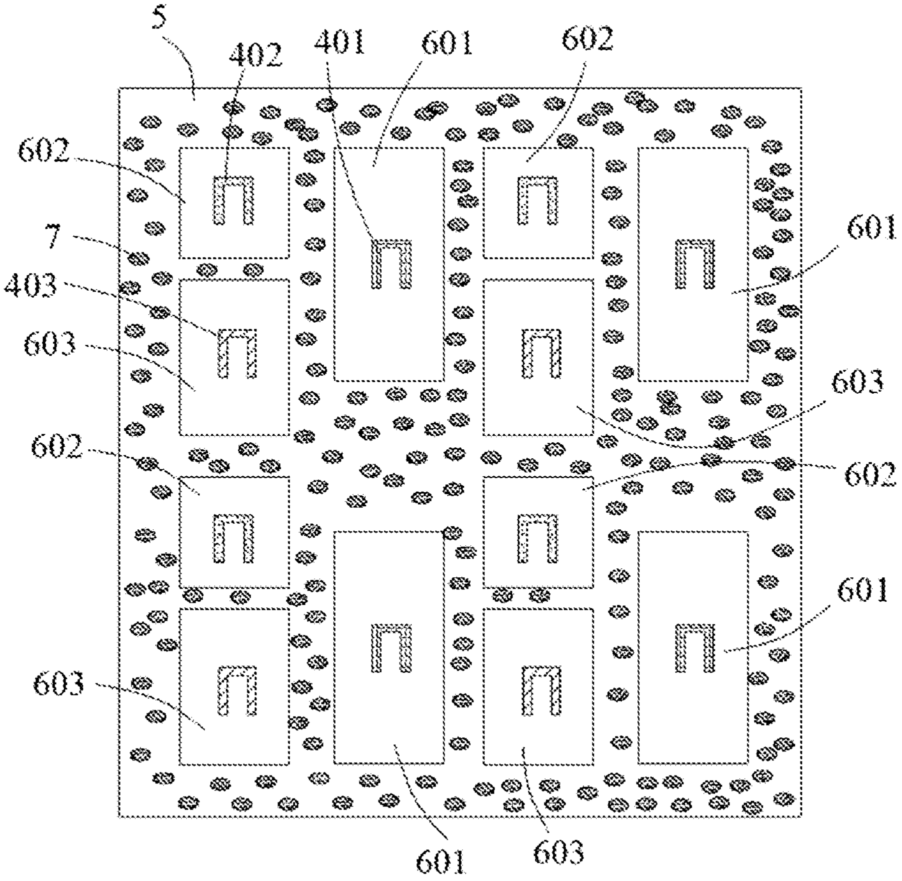
FIG. 2 is a schematic diagram of the plan layout of the display substrate shown in FIG. 1.

Taking the first sub-pixel 601 as a blue sub-pixel, the second sub-pixel 602 as a red sub-pixel, and the third sub-pixel 603 as a green sub-pixel as an example, the structure shown in FIG. 1 and FIG. 2 was used as example 1 and tested for performance. The results are shown in Table 2. It can be seen from Table 2 that when brightness of the mixed white light of the red, green and blue sub-pixels 6 decays to 80% of the initial brightness, the time is 475h, and the lifetime is increased by 15.85%. The corresponding white point coordinate shifts W-ΔCIEx and W-ΔCIEy are 0.0028, and −0.0121, respectively. The brightness decay ratios of the red, green and blue sub-pixels 6 are analyzed to be 87.8%, 76.8% and 85.9%, respectively. It can be seen that difference in the brightness decay rate of each sub-pixel has reduced to a certain extent.

TABLE 2

| | actual value | Example 1 |
|---|---|---|
| LT80/h | 410 | 475 |
| R-Lv % | 88.4% | 87.8% |
| G-Lv % | 76.0% | 76.8% |
| B-Lv % | 90.4% | 85.9% |
| W-CIEx | 0.3062 | 0.3096 |
| W-CIEy | 0.3013 | 0.3080 |
| W-ΔCIEx | −0.0006 | 0.0028 |
| W-ΔCIEy | −0.0188 | −0.0121 |

Taking the first sub-pixel 601 as a blue sub-pixel, the second sub-pixel 602 as a red sub-pixel, and the third sub-pixel 603 as a green sub-pixel as an example, the structure shown in FIG. 3 and FIG. 4 was used as Example 2 and tested for performance. The results are shown in Table 3. It can be seen from Table 3 that when brightness of the mixed white light of the red, green and blue sub-pixels 6 decays to 80% of the initial brightness, the time is 500h, and the lifetime is increased by 21.95%. The corresponding white point coordinate shifts W-ΔCIEx and W-ΔCIEy are 0.0047, and −0.0135, respectively. The brightness decay ratios of the red, green and blue sub-pixels 6 are analyzed to be 82.8%, 78% and 88.4%, respectively. It can be seen that the difference in the brightness decay rate of each sub-pixel has reduced to a certain extent.

TABLE 3

| | actual value | Embodiment 2 |
|---|---|---|
| LT80/h | 410 | 500 |
| R-Lv % | 88.4% | 82.8% |
| G-Lv % | 76.0% | 78.0% |
| B-Lv % | 90.4% | 88.4% |
| W-CIEx | 0.3062 | 0.3021 |
| W-CIEy | 0.3013 | 0.3066 |
| W-ΔCIEx | −0.0006 | −0.0047 |
| W-ΔCIEy | −0.0188 | −0.0135 |

Taking the first sub-pixel 601 as a blue sub-pixel, the second sub-pixel 602 as a red sub-pixel, and the third sub-pixel 603 as a green sub-pixel as an example, the structure shown in FIG. 5 and FIG. 6 was used as Example 3 and tested for performance. The results are shown in Table 4. It can be seen from Table 4 that when brightness of the mixed white light of the red, green and blue sub-pixels 6 decays to 80% of the initial brightness, the time is 508h, and the lifetime is increased by 23.9%. The corresponding white point coordinate shifts W-ΔCIEx and W-ΔCIEy are 0.009 and −0.0095, respectively. Brightness decay ratios of the red, green and blue sub-pixels 6 are analyzed to be 85.2%, 77.7% and 85%, respectively. It can be seen that the difference in the brightness decay rate of each sub-pixel has reduced to a certain extent.

TABLE 4

| | actual value | Embodiment 3 |
|---|---|---|
| LT80/h | 410 | 508 |
| R-Lv % | 88.4% | 85.2% |
| G-Lv % | 76.0% | 77.7% |
| B-Lv % | 90.4% | 85.0% |
| W-CIEx | 0.3062 | 0.3077 |
| W-CIEy | 0.3013 | 0.3106 |
| W-ΔCIEx | −0.0006 | 0.0009 |
| W-ΔCIEy | −0.0188 | −0.0095 |

The display substrate may further include a first heat insulating structure. One or more sub-pixels 6 in the above-mentioned plurality of sub-pixels 6 are surrounded by a first heat insulation structure to reduce the heat exchanged between the sub-pixels 6 and the outside. For example, periphery of each of the first sub-pixel 601, the second sub-pixel 602 and the third sub-pixel 603 are surrounded by the first heat insulation structure. As shown in FIG. 2. FIG. 4 and FIG. 6, taking the display substrate including the pixel definition layer 5 as an example, sidewalls of at least one opening in the pixel definition layer 5 are doped with a heat insulating medium 7 to form a first heat insulating structure. A thermal conductivity of the heat insulating medium 7 is smaller than a thermal conductivity of the material of the pixel definition layer 5. In one embodiment, the sidewalls of the openings where the first sub-pixels 601 are provided are doped with a thermal insulation medium 7. In another embodiment, the sidewalls of the openings in which the second sub-pixels 602 are provided are doped with the heat insulating medium 7. In yet another embodiment, the sidewalls of the openings where the third sub-pixels 603 are provided are doped with the thermal insulation medium 7. In other embodiments of the present disclosure, the sidewalls of the plurality of openings are all doped with the heat insulating medium 7, and the doping concentrations of the sidewalls of the openings provided with different sub-pixels 6 may be the same, or of course, may be different. Taking the same doping concentration of the sidewalls of the openings with different sub-pixels 6 as an example, the heat insulating medium 7 is uniformly doped in the pixel definition layer 5, and a mass fraction of the heat insulating medium 7 (that is, the mass ratio of the heat insulating medium 7 in the pixel definition layer 5 containing it) can be 0.5%-5%, and the thermal conductivity of the pixel definition layer 5 after doping with the thermal insulation medium 7 is 0.02-0.04 w/(mK). Taking the different doping concentration of the sidewalls of the openings provided with different sub-pixels 6 as an example, the doping concentrations of the sidewalls of the openings provided with the first sub-pixel 601 may be greater than the doping concentration of the sidewalls of the openings provided with sub-pixels of other colors, and the doping concentration of the sidewalls of the openings provided with the second sub-pixels 602 may be greater than the doping concentration of the sidewalls of the openings provided with the third sub-pixels 603.

The display substrate of the present disclosure may further be provided with second heat insulating structures 8. The second heat insulating structures may be in a cylindrical structure. Part of the area of the planarization layer 3 may be doped with the heat insulating medium 7 to form the second heat insulating structures. The outer periphery of the orthographic projection of one or more sub-pixels 6 in the above-mentioned plurality of sub-pixels 6 on the planarization layer 3 is surrounded by the second heat insulation structure. For example, the number of the second heat insulating structures may be the same as the number of the above-mentioned sub-pixels 6, and the peripheries of the orthographic projections of the above first sub-pixels 601, the second sub-pixels 602 and the third sub-pixels 603 on the planarization layer 3 are surrounded by the second heat insulation structures in one-to-one correspondence manner.

The above-mentioned heat insulating medium 7 may be an inorganic substance, such as silicon oxide. Of course, the heat insulating medium 7 may alternatively be other inorganic substances such as aluminum oxide, but the present disclosure is not limited thereto. The heat insulating medium 7 may alternatively be an organic substance. The silicon oxide may be $SiO_2$ and the aluminum oxide may be $Al_2O_3$. The heat insulating medium 7 can be nanoparticles, so that the heat insulating medium 7 can be uniformly dispersed. Diameter of the nanoparticles may be 10 nm-200 nm, and further, the diameter of the nanoparticles may be 15 nm-200 nm, for example, 15 nm, 30 nm, 50 nm, 120 nm, 200 nm, and the like.

Embodiments of the present disclosure also provide a display device. The display device may include the display substrate described in any one of the above embodiments.

Embodiments of the present disclosure also provide a vehicle. The vehicle may include the above-mentioned display device. The vehicle may be a car or the like.

The display substrate, the display device, and the vehicle provided by the embodiments of the present disclosure belong to the same inventive concept, and the descriptions of the relevant details and beneficial effects can be referred to each other, and will not be repeated here.

The above description is only the preferred embodiments of the present disclosure, and does not limit the present disclosure in any form. Although the present disclosure has been disclosed as above in preferred embodiments, it is not intended to limit the present disclosure. Personnel, without departing from the scope of the technical solutions of the present disclosure, can make some changes or modifications to equivalent embodiments of equivalent changes by using the technical contents disclosed above, but any content that does not depart from the technical solutions of the present disclosure, according to the present disclosure Any simple modifications, equivalent changes and modifications made to the above embodiments by the disclosed technical essence still fall within the scope of the technical solutions of the present disclosure.

The invention claimed is:

1. A display substrate, comprising:

a substrate;

a plurality of pixel units arranged on a side of the substrate, each of the pixel units comprises a plurality of sub-pixels, the plurality of sub-pixels comprise a first sub-pixel and a second sub-pixel, and a brightness decay rate of the first sub-pixel is less than a brightness decay rate of the second sub-pixel, each of the pixel units further comprises a third sub-pixel, the brightness decay rate of the second sub-pixel is lower than a brightness decay rate of the third sub-pixel;

thermal compensation structures in heat communication with at least some of the pixel units; and a driving circuit layer disposed on the side of the substrate and comprising a plurality of driving transistors electrically connected with the plurality of sub-pixels in one-to-one correspondence, and the thermal compensation structures are formed by the plurality of driving transistors;

wherein the plurality of driving transistors comprise a first driving transistor, a second driving transistor and a third driving transistor whose heat generation rate decreases in sequence, and an orthographic projection of the first driving transistor on the substrate is located in an orthographic projection area of the first sub-pixel on the substrate; an orthographic projection of the second driving transistor on the substrate is located in an orthographic projection area of the second sub-pixel on the substrate; and wherein the brightness decay rate is a quotient obtained by dividing a decrease in brightness of a sub-pixel from an initial brightness of the sub-pixel when mixed white light is at an initial 100% brightness thereof by a time period during which brightness of the mixed white light decays from the initial 100% brightness thereof to a predetermined level of the initial 100% brightness under a predetermined environment temperature.

2. The display substrate according to claim 1, wherein the first sub-pixel is a blue sub-pixel, the second sub-pixel is a red sub-pixel, and the third sub-pixel is a green sub-pixel.

3. The display substrate according to claim 1, wherein an orthographic projection of the third driving transistor on the substrate is located in an orthographic projection area of the third sub-pixel on the substrate.

4. The display substrate according to claim 1, wherein an orthographic projection of the third driving transistor on the substrate is located in the orthographic projection area of the first sub-pixel on the substrate.

5. The display substrate according to claim 1, wherein an orthographic projection of the third driving transistor on the substrate is located in the orthographic projection area of the second sub-pixel on the substrate.

6. The display substrate according to claim 1, wherein outer peripheries of one or more of the sub-pixels in each of the pixel units are surrounded by a first heat insulating structure.

7. The display substrate according to claim 6, wherein the display substrate comprises:

a pixel definition layer arranged on the side of the substrate and provided with a plurality of openings, the plurality of sub-pixels being arranged in the plurality of openings in a one-to-one correspondence; and a heat insulating medium, sidewalls of at least one of the openings in the pixel definition layer being doped with the heat insulating medium to form the first heat insulating structure, and a thermal conductivity of the heat insulating medium being smaller than that of a material of the pixel definition layer.

8. The display substrate according to claim 7, wherein the heat insulating medium is uniformly doped in the pixel definition layer.

9. The display substrate according to claim 7, wherein sidewalls of the openings in which the first sub-pixels are provided are doped with the heat insulating medium.

10. The display substrate according to claim 9, wherein sidewalls of the openings in which the second sub-pixels are provided are doped with the heat insulating medium, and the sidewalls of the openings in which the first sub-pixels are provided have a greater doping concentration than the sidewalls of the openings in which the second sub-pixels are provided.

11. The display substrate according to claim 10, wherein sidewalls of the openings in which the third sub-pixels are provided are doped with the heat insulating medium, and a doping concentration of the sidewalls of the openings in which the second sub-pixels are provided is greater than that of the sidewalls of the openings in which the third sub-pixels are provided.

12. The display substrate according to claim 7, wherein the display substrate further comprises:

a planarization layer disposed on the side of the substrate, wherein the pixel definition layer and the plurality of sub-pixels are disposed on a surface of the planarization layer away from the substrate; part of the planarization layer is doped with the heat insulating medium to form second heat insulating structures, and the second heat insulating structures are of a cylindrical structure; in each of the pixel units, outer peripheries of orthographic projections of one or more of the sub-pixels on the planarization layer are surrounded by the second heat insulating structures.

13. The display substrate according to claim 7, wherein the heat insulating medium is nanoparticles.

14. The display substrate according to claim 13, wherein a diameter of the nanoparticles is 10 nm-200 nm.

15. The display substrate according to claim 7, wherein the heat insulating medium is an inorganic material.

16. The display substrate according to claim 15, wherein the heat insulating medium is silicon oxide or aluminum oxide.

17. The display substrate according to claim 8, wherein a mass fraction of the heat insulating medium in the pixel defining layer is in a range of 0.5%-5%.

18. A display device, comprising a display substrate; wherein the display substrate comprises:

a substrate;

a plurality of pixel units arranged on a side of the substrate, each of the pixel units comprises a plurality of sub-pixels, the plurality of sub-pixels comprise a first sub-pixel and a second sub-pixel, and a brightness decay rate of the first sub-pixel is less than a brightness decay rate of the second sub-pixel, each of the pixel units further comprises a third sub-pixel, the brightness decay rate of the second sub-pixel is lower than a brightness decay rate of the third sub-pixel;

thermal compensation structures in heat communication with at least some of the pixel units; and a driving circuit layer disposed on the side of the substrate and comprising a plurality of driving transistors electrically connected with the plurality of sub-pixels in one-to-one correspondence, and the thermal compensation structures are formed by the plurality of driving transistors;

wherein the plurality of driving transistors comprise a first driving transistor, a second driving transistor and a third driving transistor whose heat generation rate decreases in sequence, and an orthographic projection of the first driving transistor on the substrate is located in an orthographic projection area of the first sub-pixel on the substrate; an orthographic projection of the second driving transistor on the substrate is located in an orthographic projection area of the second sub-pixel on the substrate; and wherein the brightness decay rate is a quotient obtained by dividing a decrease in brightness of a sub-pixel from an initial brightness of the sub-pixel when mixed white light is at an initial 100% brightness thereof by a time period during which brightness of the mixed white light decays from the initial 100% brightness thereof to a predetermined level of the initial 100% brightness under a predetermined environment temperature.

* * * * *